United States Patent [19]

Birman et al.

[11] 4,083,017
[45] Apr. 4, 1978

[54] OPTICAL MASER

[75] Inventors: Joseph L. Birman, Bayside; Sumner Mayburg, New York, both of N.Y.

[73] Assignee: GTE Laboratories Incorporated, Waltham, Mass.

[21] Appl. No.: 294,766

[22] Filed: Jul. 12, 1963

[51] Int. Cl.² ............................................. H01S 3/19
[52] U.S. Cl. ............................................. 331/94.5 H
[58] Field of Search ..................... 331/94.5; 330/4.3

[56] References Cited

U.S. PATENT DOCUMENTS

Re. 25,632  8/1964  Boyle et al. ..................... 331/94.5
3,102,201   8/1963  Braunstein et al. .............. 331/94.5

OTHER PUBLICATIONS

"Diode Lasers to Accelerate Optical Communications", Electronics, 11/16/62, pp. 24–25.

Primary Examiner—Nelson Moskowitz
Attorney, Agent, or Firm—Robert E. Walrath; Irving M. Kriegsman; Robert J. Frank

EXEMPLARY CLAIM

1. An optical maser comprising
   a. an optical cavity formed from a wafer of gallium arsenide having first and second contiguous $p$ and $n$ type regions with resistivities in the range $10^{-3}$ to $10^{-1}$ ohm-centimeter, said $p$ region being centrally located and having an area less than the area of said $n$ region, the surfaces of said $n$ region remote from and opposite said $p$ region being parallel to said $p$ region and optically flat,
   b. a first metallic layer secured directly to the $n$ region of said wafer on the surface remote from said $p$ region, said first metallic layer being in ohmic contact with said $n$ region and surrounding the optically flat portion of said $n$ region,
   c. a second metallic layer secured directly to the $p$ region of said wafer and being in ohmic contact therewith,
   d. first and second electrodes attached to said first and second metallic layers respectively, and
   e. means for producing a current through said optical cavity having a direction of flow from the $p$ to the $n$ region and having a magnitude sufficient to produce stimulated emission, coherent radiation being emitted from the optically flat portion of the $n$ region of said gallium arsenide wafer in a direction perpendicular to the boundary between said contiguous $p$ and $n$ regions.

2 Claims, 5 Drawing Figures

OPTICAL MASER

This invention relates to masers and in particular to a semiconductor optical maser.

The term "maser" is an acronym for "microwave amplification by stimulated emission of radiation" and an optical maser, or laser, is a maser designed for producing a stimulated radiation at a frequency falling within the range of light frequencies. Light frequencies are defined as those frequencies falling within the band including the infrared and ultraviolet or between $2 \times 10^6$ Angstroms and 100 Angstroms.

The operation of maser devices depends upon the interaction of radiation and matter. More particularly, according to present theory, radiation consists of an accumulation of photons, each of which has a quantity of energy associated with it. This accumulation of photons constitutes an electromagnetic wave. When all photons have the same energy, the wave will have one frequency uniquely determined by the photon energy. When the photons have different energies, the wave will contain a plurality of wave components at different frequencies, these frequencies corresponding to the various photon energies.

Interaction of radiation with matter ensues when matter (i.e. atoms or molecules) either absorbs or emits photons. Usually, atoms and molecules exist in a stable non-radiating or ground state in which energy is not emitted. This state corresponds to a fixed quantity or level of internal energy. When an atom is in the ground state and interacts with an incident photon, the atom can absorb the energy of the photon and be placed in a higher or "excited" state, provided that the energy of the photon is at least equal to the difference in energy of the ground and excited states. Similarly, when the energy level of an atom is suddenly changed from one state to a lower energy state, a photon may be produced. The energy of this photon will be equal to the difference in energy between these states.

At atom in an excited state can emit a photon spontaneously and revert to its ground state or to some intermediate state. However, during the period in which the atom is still excited, it can be stimulated to emit a photon by interacting with an incident photon if the energy of this photon is equal to that of the photon which would otherwise be emitted spontaneously. As a result, the incoming photon or wave is augmented by the one given up by the excited atom. This released wave falls in phase with the wave that triggered its release. Hence, an amplifying action ensues. This phenomenon is known as stimulated emission.

Under ordinary conditions, there are more atoms in the lower energy states than in the higher states. In the maser, the distribution of electrons among the energy levels is changed by a process of "pumping" so that the population is inverted; that is, there are more atoms in the higher than in the lower states. (The process of pumping consists of injecting electromagnetic energy into the assemblage of atoms to raise the atoms into excited states.) As a result, incident photons of the proper energy produce more downward than upward transitions and stimulated emission is produced.

In the maser, a suitable active material is enclosed in a cavity resonator having at least two separated reflecting walls. A wave starting out anywhere between the walls of the chamber will grow in amplitude until the wave reaches either wall where it will be reflected back into the medium. Inevitably there are losses due to imperfect reflections, absorption and scattering. However, if the amplification by stimulated emission is large enough to compensate for these losses, a steady wave can build up in the resonator.

A wave that starts at any position between the reflecting ends of the resonator will travel toward one end with increasing amplitude. When it reaches the end, the wave is reflected back toward the starting point with further increase in amplitude as it moves through the active material. The gain in energy of the wave during repeated passages compensates for losses at the reflecting surfaces and elsewhere and a steady wave builds up. Each time the wave is reflected at an end, a portion of the wave passes through this end. This portion constitutes the maser output wave.

The output of the maser is highly directional since the waves which are emitted must make any repeated passages without deviating very much from a path along the axis of the resonator. (If a wave is inclined at an angle with respect to this path, it will leave the resonator after few if any repeated reflections and will not have the opportunity to grow appreciably in amplitude.) The output waves are monochromatic (i.e. have essentially a single frequency). The initial stimulated emission at this frequency causes further emission at the same frequency.

Conventionally, solid state optical masers are excited by photons emitted by an external light source. These sources usually generate a broad spectrum of frequencies although only a narrow portion is effective in raising the electrons to higher energy levels within the maser material. In addition, the impurity centers within known maser materials such as chromium doped aluminum oxide are widely scattered thereby further reducing the total number of incident photons which are absorbed and therefore effective in producing coherent light output.

Accordingly, it is an object of our invention to provide a solid state optical maser in which electrical energy is converted directly to coherent optical radiation without the interposition of an external light source.

In the present invention, coherent radiation is achieved by electrical excitation of an optical cavity formed from a semiconductor wafer having first and second contiguous regions of opposite conductivity. The current flowing as a result of this excitation is above a threshold value defined as the minimum current required to produce stimulated emission. Opposite surfaces of the wafer are made parallel to an extremely high degree and flat to within a fraction of a wavelength thereby creating the optical cavity.

The semiconductors which may be employed in our invention are those which exhibit a quantum efficiency approaching unity for the process of injection electroluminescence. That is, the ratio of the number of current carriers injected into the semiconductors to the number of photons emitted by the device approaches unity. Injection electroluminesence may be defined as that process in which photons are emitted as the result of the passage of a current in the forward bias direction of a $p$-$n$ junction. Typical semiconductors belonging to this class are gallium arsenide, aluminum antimonide and indium phosphide.

In our semiconductor optical maser, impurities are introduced into the semiconductor optical cavity to form within the cavity contiguous $n$ and $p$ type regions having impurity concentrations between $10^{17}$ to $10^{19}$ atoms per cubic centimeter producing a resistivity in the approximate range $10^{-3}$ to $10^{-1}$ ohm-centimeter. In the n-type region, there is an excess number of electrons or negative charge carriers and in the p type region there is an excess of holes or positive charge carriers. Under equilibrium conditions, the product of the number of electrons and holes in each region is substantially constant but this equilibrium may be disturbed by the injection of carriers into the semiconductor. These carriers move though the n and p regions combining with each other at or near the junction within the cavity to emit coherent radiation at or near the energy separation between the valence and conduction bands.

While the mechanism by which coherent radiation is obtained from the present optical maser is not fully understood, it is believed that it involves transitions between energy levels near the top and bottom of the valence and conduction bands respectively. This is in contrast to the mechanism employed in conventional solid state masers (such as the chromium-doped ruby device discussed by T. H. Maiman at page 1145 et seq. in the August 1961 issue of the Physical Review) in which optical transitions occur between three discrete energy levels. In our device the response time (i.e. the time between application of a voltage to the maser and the emission of coherent light) is on the order of tenths of microseconds whereas in the ruby maser triggered by a flash lamp, the response time is normally on the order of milliseconds.

In one embodiment of the invention, the semiconductor wafer comprises a gallium arsenide wafer having contiguous p and n type zones, the optical cavity being obtained by making the ends of the wafer which are perpendicular to the plane of the p-n junction optically flat and parallel. With this configuration, coherent emission is obtained in the plane of the junction. In another embodiment, the flat and parallel surfaces of the semiconductor are parallel to the plane of the p-n junction. In this version, light emission is obtained through an optically flat portion of the n-type region in a direction perpendicular to the plane of the junction.

The above objects and the brief introduction to the present invention will be more fully discussed and further objects and advantages will become apparent from a study of the following description in connection with the drawings wherein:

FIG. 2b is a cross-sectional view of the device of FIG. 2a.

Figure 1:
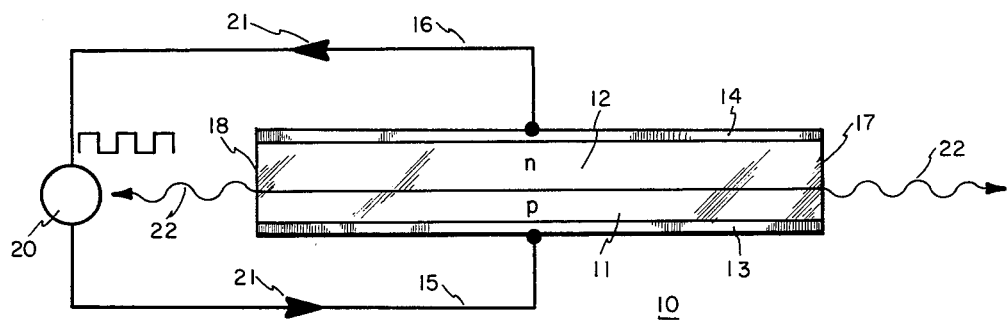
FIG. 1 is a schematic diagram of a semiconductor optical maser in which radiation is produced in the plane of the p-n junction.

Referring to FIG. 1, there is shown a schematic cross-sectional diagram of a semiconductor wafer 10 having a p type region 11 and an n type region 12 between two electrodes 13 and 14. Ohmic contacts are made to regions 11 and 12 by soldering leads 15 and 16 to electrodes 13 and 14 respectively. The ends 17 and 18 of wafer 10 are parallel to each other and flat to within a fraction of a wavelength. In a typical optical maser, the n region 12 is formed of selenium-doped gallium arsenide and the p region 11 is formed by diffusing zinc into the selenium-doped galliuum arsenide. Alternatively, other impurities such as tellurium or tin may be used in the gallium arsenide base material. The resistivities of the n and p regions are in the range $10^{-3}$ to $10^{-1}$ ohm-centimeter. The end surfaces 17 and 18 are made parallel to within 15 seconds of arc and flat to within ¼ micron. Typically, the distance between surfaces 17 and 18 is 20 mils, the thickness of the n and p regions 6 mils and 3 mils respectively and the width of the end surfaces 17 and 18 is 10 mils.

Leads 15 and 16 are connected to a current generator 20. When current pulses of sufficient magnitude are passed through the p-n junction in the forward direction indicated by arrows 21, coherent radiation having a wavelength corresponding to the energy separation between the valence and conduction band is emitted from the junction. This radiation is in the plane of the junction and emanates principally from the polished ends as depicted by the arrows 22. Radiation may be obtained from one end only, if desired, by silvering the othher end so that all of the incident photons are reflected and none are emitted through the silvered surface.

In fabricating an optical maser of the type shown in FIG. 1, opposite faces of a 25 mil thick slice of selenium-doped gallium arsenide (n type) are ground and lapped until the surfaces are parallel to within 15 seconds of arc and flat to within .25 microns. Zinc is then diffused into the slice to form a p-n junction, a high zinc concentration being produced at the surface of the diffused layer to assure minimum contact resistance. Following diffusion of the zinc, nickel is incorporated onto the diffused surface and heat treated in a forming as atmosphere. Nickel produces a good ohmic contact to high conductivity p type gallium arsenide and produces a good base for soldering. The p type layer is then ground until the thickness of the wafer is about 0.010 inch. Next the 0.01 inch thick diffused slice is cut into strips and the sides 17 and 18 polished to a flatness of less than ¼ micron. The strips are then diced to form rectangular parallelpipeds such as that shown in FIG. 1 and mounted on a suitable base.

Figure 2A:
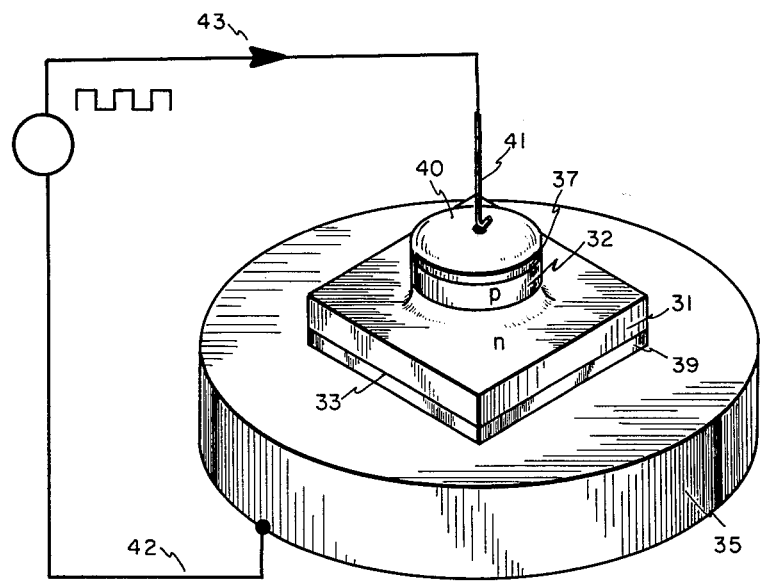
FIG. 2a is a perspective view of an optical maser in which radiation is produced in a direction normal to the plane of the p-n junction.
Figure 2B:
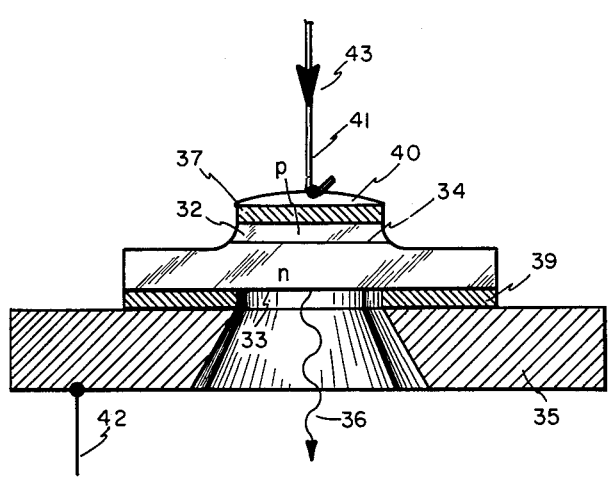

FIGS. 2a and 2b are perspective and cross-sectional views respectively of a semiconductor optical maser in which radiation is emitted normal to the plane of the p-n junction. In this embodiment, the optical maser comprises an n region 31 and a p region 32 located near the center of the n region. The surface 33 of the n region 31 immediately below p region 32 is made optically flat to within 0.25 micron thereby forming an optical cavity in conjunction with the p region. The maser is mounted on a metallic header 35 having an opening below the junction for passage of the emitted light indicated by arrow 36. A layer of nickel 37 is deposited on p layer 32 to provide good ohmic contact. In a typical maser of this type, the diameter of the p region is 15 mils and its thickness 3 mils. The n region is approximately 50 mils on a side and its thickness is 6 mils.

The device shown in FIGS. 2a and 2b may be fabricated by diffusing zinc into selenium-doped gallium arsenide slices as in the case of the device of FIG. 1. However, instead of optically polishing the ends of the semiconductor normal to the plane of the junction, the surface 33 of the n region 31 is polished to make it flat and parallel to the surface of the p layer on which the nickel layer has been deposited.

A die about 100 mils square is next cut from the slice and a quartz disc 60 mils in diameter is placed in the center of the die on the surface 33. A film consisting of four parts gold and one part tin is evaporated onto the exposed $n$ type surface and heat treated at 500° C for about 7 minutes in a forming gas atmosphere. Nickel is then vacuum evaporated onto the unmasked surface of $n$ region 31 and the surface of $p$ layer 32 forming metallic layers 37 and 39 respectively. Next, the die is mounted on the metallic header 35 with the highly polished circular region 33 positioned above the hole in the center of the header. Following the mounting of the die on header 35, the center of the $p$ region directly above the hole in the header is covered by a wax dot and the remainder of the evaporated metal ohmic contact etched away. The "mesa" structure shown in FIGS. 2a and 2b is then formed by sandblasting and etching away the excess $p$ and $n$ type material. The wax dot protects the ohmic contact during formation of the mesa and is relatively unaffected by the sand blasting and etching. Finally, a soft copper strip 41 is secured to the nickel film 37 by a layer of solder 40 to form an input connection. A second lead 42 is connected to header 35.

When the maser is excited by passing a current in the direction indicated by arrow 43 from the $p$ to the $n$ region, coherent radiation is emitted in a direction perpendicular to $p$-$n$ junction 34 as indicated by arrow 36. Specifically, emission in the range 8400 to 8450 Angstroms has been obtained from the masers shown in both FIGS. 1 and 2 when pulsed to produce current densities in the range 3000 to 6000 Amperes per square centimeter. The pulse duration is between 1 and 5 microseconds and the repetition rate from 10 pulses per second to 500 pulses per second.

Figure 3:
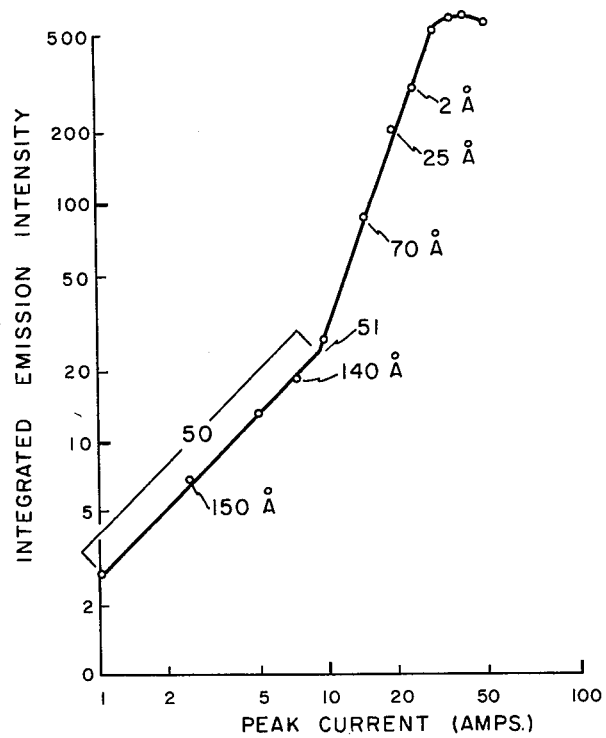
FIG. 3 is a plot of the emission intensity of a typical semiconductor optical maser as a function of peak excitation current.

FIG. 3 is a plot of the log of the integrated intensity in arbitrary units of the radiation emitted by a maser of the type shown in FIGS. 2a and 2b as a function of the log of the peak current measured in amperes. The particular device tested had the same dimensions as the maser previously described, an average resistivity in the $n$ region of 0.0015 ohm-centimeter and in the $p$ region of 0.0025 ohm-centimeter. The $n$ region consisted of selenium-doped gallium arsenide and the $p$ region was formed by diffusing zinc into the selenium-doped gallium arsenide.

For peak current in the range designated 50 on FIG. 3, the device is operating below threshold and the light output is a linear function of current. The break point 51 indicates the current at which stimulated emission begins, the bandwidths of the radiation being indicated on the curve for currents above and below point 51. As shown, the bandwidth immediately below the point 51 at which stimulated emission begins is about 140 Angstroms while for currents above the break point the bandwidth decreases sharply. The applied current pulses used in FIG. 3 had a width of about three microseconds and a repetition rate of 300 pulses per second. For peak currents above the value where the emission band narrows to 25 Angstroms, line structure appears in the emission with line widths of several Angstroms to several tenths of one Angstrom.

Figure 4:
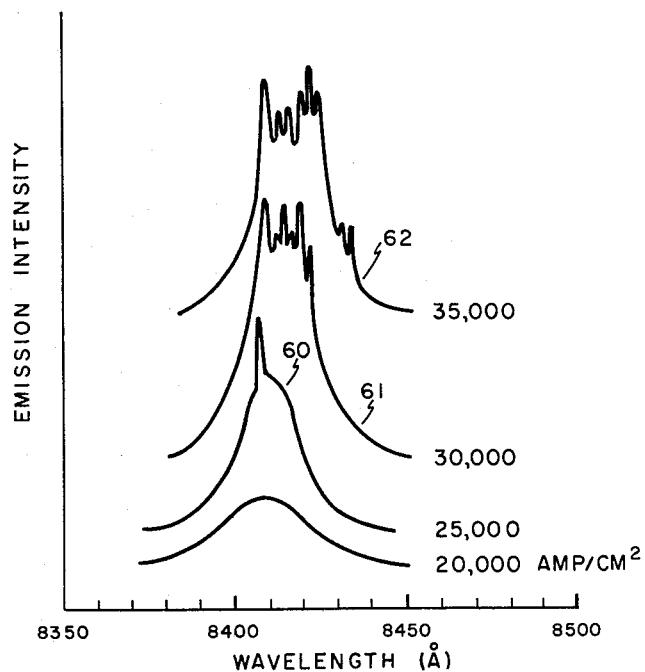
FIG. 4 is a plot of the emission intensity of the maser as a function of wavelength.

FIG. 4 is a plot of the log of emission intensity in arbitary units against the wavelength of the output radiation for different values of current density. This curve shows the characteristic sharp increase in emission intensity at the threshold (curve 60) and the extreme narrowing of the bandwidth of the emitted radiation as the current density is increased (curves 61 and 62).

As many changes could be made in the above construction and many different embodiments could be made without departing from the scope thereof, it is intended that all matter contained in the above description or shown in the accompanying drawings shall be interpreted as illustrative and not in a limiting sense.

What is claimed is:

1. An optical maser comprising
   a. an optical cavity formed from a wafer of gallium arsenide having first and scond contiguous $p$ and $n$ type regions with resistivities in the range $10^{-3}$ to $10^{-1}$ ohm-centimeter, said $p$ region being centrally located and having an area less than the area of said $n$ region, the surfaces of said $n$ region remote from and opposite said $p$ region being parallel to said $p$ region and optically flat,
   b. a first metallic layer secured directly to the $n$ region of said wafer on the surface remote from said $p$ region, said first metallic layer being in ohmic contact with said $n$ region and surrounding the optically flat portion of said $n$ region,
   c. a second metallic layer secured directly to the $p$ region of said wafer and being in ohmic contact therewith,
   d. first and second electrodes attached to said first and second metallic layers respectively, and
   e. means for producing a current through said optical cavity having a direction of flow from the $p$ to the $n$ region and having a magnitude sufficient to produce stimulated emission, coherent radiation being emitted from the optically flat portion of the $n$ region of said gallium wafer in a direction perpendicular to the boundary between said contiguous $p$ and $n$ regions.

2. An optical maser as defined by claim 1 wherein the resistivities of the $n$ and $p$ regions are 0.0015 and 0.0025 ohm-centimeter respectively.

* * * * *